United States Patent
Liu et al.

(10) Patent No.: US 11,881,820 B2
(45) Date of Patent: Jan. 23, 2024

(54) POWER CONTROL CIRCUIT

(71) Applicant: SMARTER MICROELECTRONICS (GUANG ZHOU) CO., LTD., Guangzhou (CN)

(72) Inventors: Chifeng Liu, Guangzhou (CN); Qiang Su, Guangzhou (CN); Qiming Wang, Guangzhou (CN); Jiangtao Yi, Guangzhou (CN)

(73) Assignee: SMARTER MICROELECTRONICS (GUANG ZHOU) CO., LTD., Guangzhou (CN)

( * ) Notice: Subject to any disclaimer, the term of this patent is extended or adjusted under 35 U.S.C. 154(b) by 535 days.

(21) Appl. No.: 17/139,928

(22) Filed: Dec. 31, 2020

(65) Prior Publication Data

US 2021/0257976 A1  Aug. 19, 2021

Related U.S. Application Data

(63) Continuation of application No. PCT/CN2020/118564, filed on Sep. 28, 2020.

(30) Foreign Application Priority Data

Feb. 18, 2020  (CN) .......................... 202010099884.6

(51) Int. Cl.
| | |
|---|---|
| *H03F 1/22* | (2006.01) |
| *H03F 3/193* | (2006.01) |
| *H03F 3/24* | (2006.01) |
| *H03F 3/45* | (2006.01) |
| *H04B 1/40* | (2015.01) |
| *H04B 1/3827* | (2015.01) |

(52) U.S. Cl.
CPC ............. *H03F 3/193* (2013.01); *H03F 3/245* (2013.01); *H03F 3/45273* (2013.01); *H03F 2200/451* (2013.01); *H04B 1/3827* (2013.01); *H04B 1/40* (2013.01)

(58) Field of Classification Search
CPC .................................... H03F 1/22; H03F 3/04
USPC .................................................. 330/288, 311
See application file for complete search history.

(56) References Cited

U.S. PATENT DOCUMENTS

| | | | | |
|---|---|---|---|---|
| 6,194,967 B1 * | 2/2001 | Johnson | ................... | G05F 3/262 |
| | | | | 330/288 |
| 7,312,651 B2 * | 12/2007 | Kudo | ...................... | G05F 3/262 |
| | | | | 330/288 |
| 7,876,158 B2 * | 1/2011 | Chow | ...................... | H03F 3/195 |
| | | | | 330/288 |

* cited by examiner

*Primary Examiner* — Henry Choe
(74) *Attorney, Agent, or Firm* — Syncoda LLC; Feng Ma

(57) ABSTRACT

A power control circuit includes a negative feedback loop, and a radio frequency signal path including a first NMOS transistor having a gate configured as a radio frequency signal input end, a drain connected with a source of a second NMOS transistor, and a source connected with a ground terminal. A drain of the second NMOS transistor is configured as a radio frequency signal output end and connected with a first voltage source. The negative feedback loop includes a third NMOS transistor having a gate connected with an output end of a differential amplifier, a source connected with the ground terminal, and a drain connected with a source of a fourth NMOS transistor having a gate connected with a reverse input end of the differential amplifier and with a second voltage source, and a drain connected with a forward input end and a first bias current source.

12 Claims, 4 Drawing Sheets

POWER CONTROL CIRCUIT

CROSS-REFERENCE TO RELATED APPLICATIONS

This application is a continuation of International Application No. PCT/CN2020/118564 filed on Sep. 28, 2020, which claims priority to Chinese Patent Application No. 202010099884.6 filed on Feb. 18, 2020. The disclosures of these applications are hereby incorporated by reference in their entirety.

BACKGROUND

Radio-frequency power amplifiers may also be referred to as power amplifiers. When a power amplifier is saturated, a power control circuit is required to control the output power of the power amplifier. There are generally two ways of power control, namely current control and voltage control, respectively. Herein, the way of current control is to control the gate bias voltage of the amplification transistor of the power amplifier so as to control the bias current of the amplification transistor.

SUMMARY

When a power control circuit is configured to control the output power of the radio frequency power amplifier, a channel length modulation effect may affect or reduce the performance of the radio frequency amplifier, and various embodiments of the present disclosure provide a power control circuit that can address such effects.

Some embodiments of the disclosure provide a power control circuit, including: a radio frequency signal path and a negative feedback loop;
  the radio frequency signal path includes: a first NMOS transistor and a second NMOS transistor;
  a gate of the first NMOS transistor is configured as a radio frequency signal input end, a drain of the first NMOS transistor is connected with a source of the second NMOS transistor, and a source of the first NMOS transistor is connected with a ground terminal; a drain of the second NMOS transistor is configured as a radio frequency signal output end and is connected with a first voltage source;
  the negative feedback loop includes: a third NMOS transistor, a fourth NMOS transistor and a differential amplifier;
  a gate of the third NMOS transistor is connected with an output end of the differential amplifier, a source of the third NMOS transistor is connected with the ground terminal, and a drain of the third NMOS transistor is connected with a source of the fourth NMOS transistor; a gate of the fourth NMOS transistor is connected with a reverse input end of the differential amplifier and is connected with a second voltage source, and a drain of the fourth NMOS transistor is connected with a forward input end of the differential amplifier and is connected with a first bias current source;
  the gate of the first NMOS transistor is connected with the output end of the differential amplifier; a gate of the second NMOS transistor is connected with the second voltage source;
  each of the second NMOS transistor and the fourth NMOS transistor operates in a saturation region, so that power control of the first NMOS transistor is performed.

In the above solution, the value of width-length ratio of the third NMOS transistor and the first NMOS transistor is equal to the value of width-length ratio of the fourth NMOS transistor and the second NMOS transistor.

In the above solution, the power control circuit further includes: a first resistor; the gate of the first NMOS transistor is connected with the output end of the differential amplifier via the first resistor.

In the above solution, the power control circuit further includes: a second resistor; the gate of the second NMOS transistor is connected with the second voltage source via the second resistor.

In the above solution, the power control circuit further includes: an inductor; the drain of the second NMOS transistor is connected with the first voltage source via the inductor.

In the above solution, when drain voltage and gate voltage of the fourth NMOS transistor are equal, the fourth NMOS transistor operates in the saturation region.

In the above solution, the power control circuit further includes: a fifth NMOS transistor; the gate of the fourth NMOS transistor is connected with the reverse input end of the differential amplifier via the fifth NMOS transistor; gate and drain of the fifth NMOS transistor are short-connected; a source of the fifth NMOS transistor is connected with a first end of a second bias current source; a second end of the second bias current source is connected with the ground terminal.

In the above solution, threshold voltage of the fifth NMOS transistor is equal to threshold voltage of the fourth NMOS transistor; the fifth NMOS transistor operates in a weak inversion region.

In the above solution, when drain voltage of the fourth NMOS transistor is equal to gate voltage of the fourth NMOS transistor minus threshold voltage thereof, the fourth NMOS transistor operates in the saturation region.

In the above solution, the gate of the fourth NMOS transistor is connected with the drain of the fifth NMOS transistor; the source of the fifth NMOS transistor is connected with the reverse input end of the differential amplifier.

Various embodiments of the present disclosure provide a power control circuit, including: a radio frequency signal path and a negative feedback loop; the radio frequency signal path includes: a first NMOS transistor and a second NMOS transistor; a gate of the first NMOS transistor is configured as a radio frequency signal input end, a drain of the first NMOS transistor is connected with a source of the second NMOS transistor, and a source of the first NMOS transistor is connected with a ground terminal; a drain of that second NMOS transistor is configured as a radio frequency signal output end and is connected with a first voltage source; the negative feedback loop includes: a third NMOS transistor, a fourth NMOS transistor and a differential amplifier; a gate of the third NMOS transistor is connected with an output end of the differential amplifier, a source of the third NMOS transistor is connected with the ground terminal, and a drain of the third NMOS transistor is connected with a source of the fourth NMOS transistor; a gate of the fourth NMOS transistor is connected with a reverse input end of the differential amplifier and is connected with a second voltage source, and a drain of the fourth NMOS transistor is connected with a forward input end of the differential amplifier and is connected with a first bias current source; the gate of the first NMOS transistor is connected with the output end of the differential amplifier; a gate of the second NMOS transistor is connected with the second voltage source; each of the second NMOS transistor and the fourth NMOS transistor operates in a saturation region. As such, the radio frequency signal path does not pass through the analog signal, the performance of the first NMOS transistor is not affected, while the control accuracy of the output power is improved.

The power control circuit can be, for example, part of a wireless communication apparatus and system.

DETAILED DESCRIPTION

In order to understand the characteristics and technical contents of the embodiments of the disclosure in more detail, the implementation of the embodiments of the disclosure will be described in detail below with reference to the appended figures, which are for reference only and are not intended to limit the embodiments of the disclosure.

Figure 1:
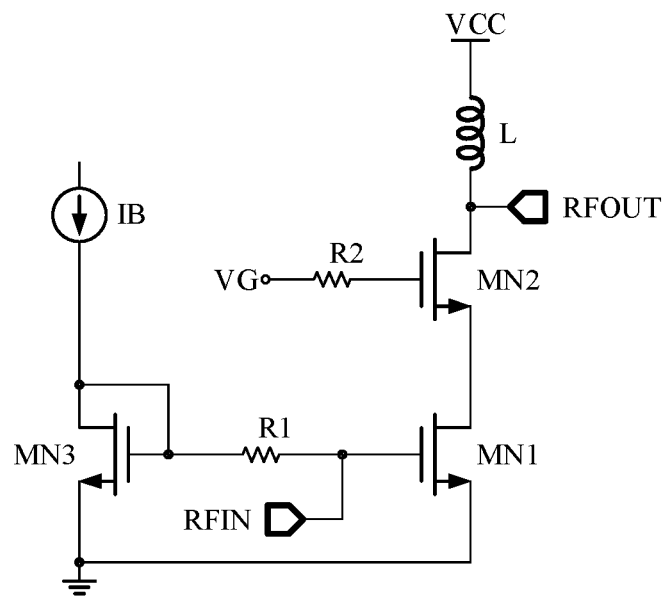
FIG. 1 is a schematic structural diagram of the first composition of a power control circuit according to some embodiments.

FIG. 1 is a schematic structural diagram of the first composition of a power control circuit according to some embodiments. As illustrated in FIG. 1, the drain of the transistor MN3 is connected with a current source IB, the drain and the gate of the transistor MN3 are short-circuited; the drain of the transistor MN1 is connected with the source of the transistor MN2, the gate of the transistor MN1 is configured as a radio frequency signal input end; the gate of the transistor MN3 is connected with the gate of the transistor MN1, and a resistor R1 is connected in series there-between, the source of the transistor MN3 and the source of the transistor MN1 are both connected with a ground terminal; the gate of the transistor MN2 is connected with a voltage source VG, and a resistor R2 is connected in series there-between, the drain of the transistor MN2 is connected with a voltage source VCC, and an inductor L is connected in series there-between, while the drain of the transistor MN2 is configured as a radio frequency signal output end. Based on the above circuit connection, the channel modulation effect objectively exists, which introduces a large deviation when the bias current IB passing through MN3 is mirrored to MN1, thus leading to a large deviation of saturation power.

Figure 2:
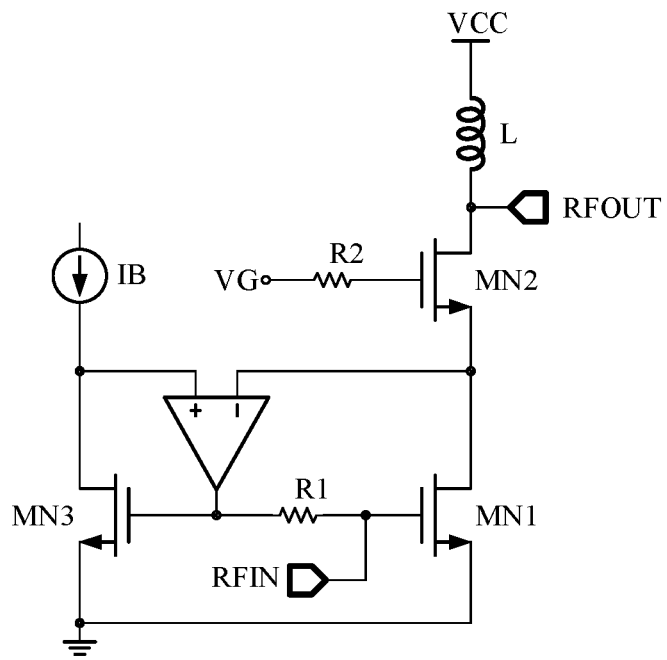
FIG. 2 is a schematic structural diagram of the second composition of a power control circuit according to some embodiments.

FIG. 2 is a schematic structural diagram of the second composition of a power control circuit according to some embodiments. As illustrated in FIG. 2, a differential amplifier is added on the basis of FIG. 1, and specifically, the forward input end of the differential amplifier is connected with the drain of the transistor MN3, the reverse input end of the differential amplifier is connected with the drain of the transistor MN1, the output end of the differential amplifier is connected with the gate of the transistor MN3 and one end of the resistor R1. Other parts are connected in the same way as described in FIG. 1. Among them, the transistor MN1, the transistor MN3 and the differential amplifier form a feedback loop. By introducing a differential operational amplifier, the drain voltages of the transistors MN1 and MN3 are equal, thus eliminating the effect of channel length modulation effect and improving the control accuracy of current. However, due to the presence of the radio frequency power amplification transistor MN1 in the feedback loop, a part of the radio frequency signal path will pass through the analog signal, which will interfere with the radio frequency signal and reduce the performance of the radio frequency power amplifier.

When a radio frequency power amplifier is saturated, a power control circuit is required to control the output power of the radio frequency power amplifier. There are generally two ways of power control, namely current control and voltage control, respectively. Herein, the way of current control is to control the gate bias voltage of the amplification transistor of the power amplifier so as to control the bias current of the amplification transistor.

Figure 3:
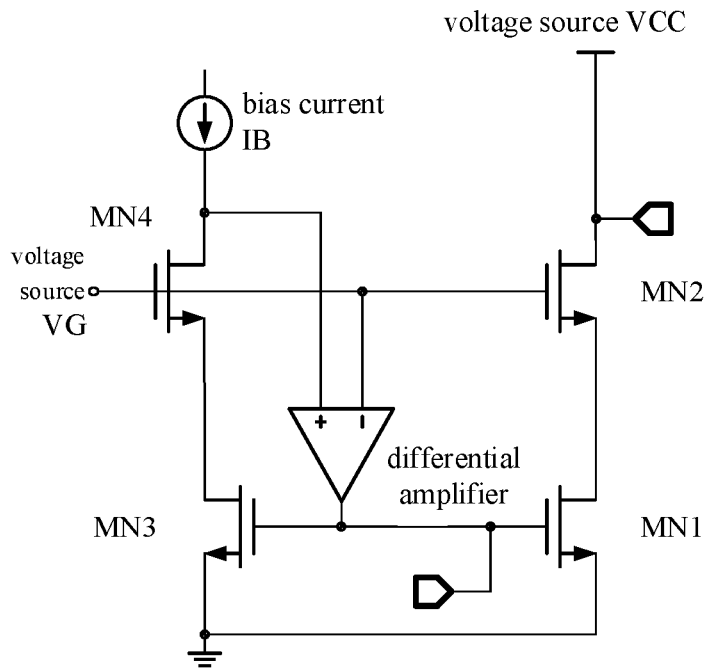
FIG. 3 is a schematic structural diagram of the first composition of a power control circuit of an embodiment of the disclosure.

Based on the problem that the channel length modulation effect affects and reduces the performance of the radio frequency amplifier in the existing power control circuit, the embodiments of the disclosure provide a power control circuit, FIG. 3 is a structural circuit diagram of a power control circuit of an embodiment of the disclosure, which solves the above two problems. As illustrated in FIG. 3, the circuit specifically includes: a radio frequency signal path and a negative feedback loop;

the radio frequency signal path includes: a first NMOS transistor MN1 and a second NMOS transistor MN2;
   a gate of the transistor MN1 is configured as a radio frequency signal input end, a drain of the transistor MN1 is connected with a source of the transistor MN2, and a source of the transistor MN1 is connected with a ground terminal; a drain of the transistor MN2 is configured as a radio frequency signal output end and is connected with a first voltage source VCC;
the negative feedback loop includes: a third NMOS transistor MN3, a fourth NMOS transistor MN4 and a differential amplifier;
a gate of the transistor MN3 is connected with an output end of the differential amplifier, a source of the transistor MN3 is connected with the ground terminal, and a drain of the transistor MN3 is connected with a source of the transistor MN4; a gate of the transistor MN4 is connected with a reverse input end of the differential amplifier and is connected with a second voltage source VG, and a drain of the transistor MN4 is connected with a forward input end of the differential amplifier and is connected with a first bias current source IB;
the gate of the transistor MN1 is connected with the gate of the transistor MN3; a gate of the transistor MN2 is connected with the second voltage source VG;
each of the transistor MN2 and the transistor MN4 operates in a saturation region, so that power control of the transistor MN1 is performed.

In some embodiments, the value of width-length ratio of the transistor MN3 and the transistor MN1 is equal to the value of width-length ratio of the transistor MN4 and the transistor MN2.

Specifically, in order to avoid a large deviation when the first bias current passing through the transistor MN3 is mirrored to the transistor MN1, the drain voltage of the transistor MN3 shall be equal to the drain voltage of the transistor MN1. Therefore, for the above purpose, the transistor MN4 is added to the existing power control circuit of FIG. 1, and the value of width-length ratio of the transistor MN3 and the transistor MN1 is equal to the value of width-length ratio of the transistor MN4 and the transistor MN2.

In some embodiments, when drain voltage and gate voltage of the transistor MN4 are equal, the transistor MN4 operates in the saturation region.

Specifically, the gate of the transistor MN4 is connected with the reverse input end of the differential amplifier, and the drain of the transistor MN4 is connected with the forward input end of the differential amplifier, so that the gate voltage and drain voltage of the transistor MN4 are equal. Furthermore, the gate-source voltage of the transistor MN4 is equal to the drain-source voltage of the transistor MN4, and since the condition for the transistor MN4 operating in the saturation region is that the gate-source voltage of the transistor MN4 minus the threshold voltage thereof is less than the drain-source voltage of the transistor MN4, the transistor MN4 operates in the saturation region.

Furthermore, it is known that the transistor MN2 operates in the saturation region, and the transistor MN4 also operates in the saturation region; the gate of the transistor MN2 and the gate of the transistor MN4 are both connected with the second voltage source VG; the value of width-length ratio of the transistor MN3 and the transistor MN1 is equal to the value of width-length ratio of the transistor MN4 and the transistor MN2, and based on the above three conditions, it is concluded that the source voltage of the transistor MN2 is equal to the source voltage of the transistor MN4.

The source of the transistor MN4 is connected with the drain of the transistor MN3, the drain of the transistor MN1 is connected with the source of the transistor MN2, so that the source voltage of the transistor MN4 is equal to the drain voltage of the transistor MN3, and the source voltage of the transistor MN2 is equal to the drain voltage of the transistor MN1. Furthermore, the drain voltage of the transistor MN3 is equal to the drain voltage of the transistor MN1, thus there is no large deviation when the first bias current source IB passing through the transistor MN3 is mirrored to the transistor MN1, thereby improving the control accuracy of the bias current passing through the transistor MN1.

Figure 4:
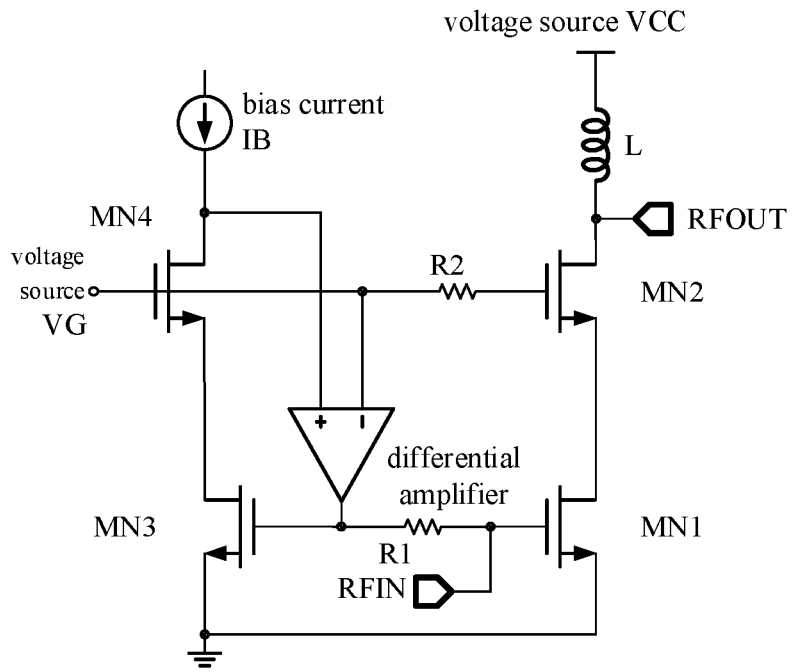
FIG. 4 is a schematic structural diagram of the second composition of a power control circuit of an embodiment of the disclosure.

In view of the schematic structural diagram of the first composition of a power control circuit in FIG. 3, the disclosure gives a specific circuit diagram. FIG. 4 is a schematic structural diagram of the second composition of a power control circuit of an embodiment of the disclosure.

As illustrated in FIG. 4, the radio frequency signal path includes: a transistor MN1 and a transistor MN2; a gate of the transistor MN1 is configured as a radio frequency signal input end, a drain of the transistor MN1 is connected with a source of the transistor MN2, and a source of the transistor MN1 is connected with a ground terminal; a drain of the transistor MN2 is configured as a radio frequency signal output end and is connected with a voltage source VCC; the negative feedback loop includes: a transistor MN3, a transistor MN4 and a differential amplifier; a gate of the transistor MN3 is connected with an output end of the differential amplifier, a source of the transistor MN3 is connected with a ground terminal, and a drain of the transistor MN3 is connected with a source of the transistor MN4; a gate of the transistor MN4 is connected with a reverse input end of the differential amplifier and is connected with a voltage source VG, and a drain of the transistor MN4 is connected with a forward input end of the differential amplifier and is connected with a bias current source IB; the gate of the transistor MN1 is connected with the gate of the transistor MN3; a gate of the transistor MN2 is connected with the voltage source VG; each of the transistor MN2 and the transistor MN4 operates in a saturation region, so that power control of the transistor MN1 is performed.

In the above technical solution, the radio frequency signal path does not pass through the analog signal, that is, the analog signal does not interfere with the radio frequency signal, and does not reduce the performance of the radio frequency power amplifier.

Herein, the value of width-length ratio of the transistor MN3 and the transistor MN1 is equal to the value of width-length ratio of the transistor MN4 and the transistor MN2.

The first end of resistor R1 is connected with the output end of the differential amplifier, and the second end of the resistor R1 is connected with the gate of the transistor MN1.

The first end of resistor R2 is connected with the voltage source VG and is connected with the reverse input end of the differential amplifier, the second end of the resistor R2 is connected with the gate of the transistor MN2.

One end of inductor L is connected with the drain of the transistor MN2 and the other end of the inductor L is connected with the voltage source VCC.

The gate of the transistor MN4 is connected with the reverse input end of the differential amplifier, and the drain of the transistor MN4 is connected with the forward input end of the differential amplifier, so that the gate voltage and drain voltage of the transistor MN4 are equal. Furthermore, the gate-source voltage of the transistor MN4 is equal to the drain-source voltage of the transistor MN4, and since the condition for the transistor MN4 operating in the saturation region is that the gate-source voltage of the transistor MN4 minus the threshold voltage thereof is less than the drain-source voltage of the transistor MN4, the transistor MN4 operates in the saturation region.

Furthermore, it is known that the transistor MN2 operates in the saturation region, and the transistor MN4 also operates in the saturation region; the gate of the transistor MN2 and the gate of the transistor MN4 are both connected with the voltage source VG; the value of width-length ratio of the transistor MN3 and the transistor MN1 is equal to the value of width-length ratio of the transistor MN4 and the transistor MN2, and based on the above three conditions, it is concluded that the source voltage of the transistor MN2 is equal to the source voltage of the transistor MN4.

The source of the transistor MN4 is connected with the drain of the transistor MN3, the drain of the transistor MN1 is connected with the source of the transistor MN2, so that the source voltage of the transistor MN4 is equal to the drain voltage of the transistor MN3, and the source voltage of the transistor MN2 is equal to the drain voltage of the transistor MN1. Furthermore, the drain voltage of the transistor MN3 is equal to the drain voltage of the transistor MN1, thus there is no large deviation when the bias current source IB1 passing through the transistor MN3 is mirrored to the transistor MN1, thereby improving the control accuracy of the bias current passing through the transistor MN1.

Various embodiments of the present disclosure provide a power control circuit, including: a radio frequency signal path and a negative feedback loop; the radio frequency signal path includes: a first NMOS transistor and a second NMOS transistor; a gate of the first NMOS transistor is configured as a radio frequency signal input end, a drain of the first NMOS transistor is connected with a source of the second NMOS transistor, and a source of the first NMOS transistor is connected with a ground terminal; a drain of that second NMOS transistor is configured as a radio frequency signal output end and is connected with a first voltage source; the negative feedback loop includes: a third NMOS transistor, a fourth NMOS transistor and a differential amplifier; a gate of the third NMOS transistor is connected with an output end of the differential amplifier, a source of the third NMOS transistor is connected with the ground terminal, and a drain of the third NMOS transistor is connected with a source of the fourth NMOS transistor; a gate of the fourth NMOS transistor is connected with a reverse input end of the differential amplifier and is connected with a second voltage source, and a drain of the fourth NMOS transistor is connected with a forward input end of the differential amplifier and is connected with a first bias current source; the gate of the first NMOS transistor is connected with the output end of the differential amplifier; a gate of the second NMOS transistor is connected with the second voltage source; each of the second NMOS transistor and the fourth NMOS transistor operates in a saturation region. As such, the radio frequency signal path does not pass through the analog signal, the performance of the first NMOS transistor is not affected, while the control accuracy of the output power is improved.

Figure 5:
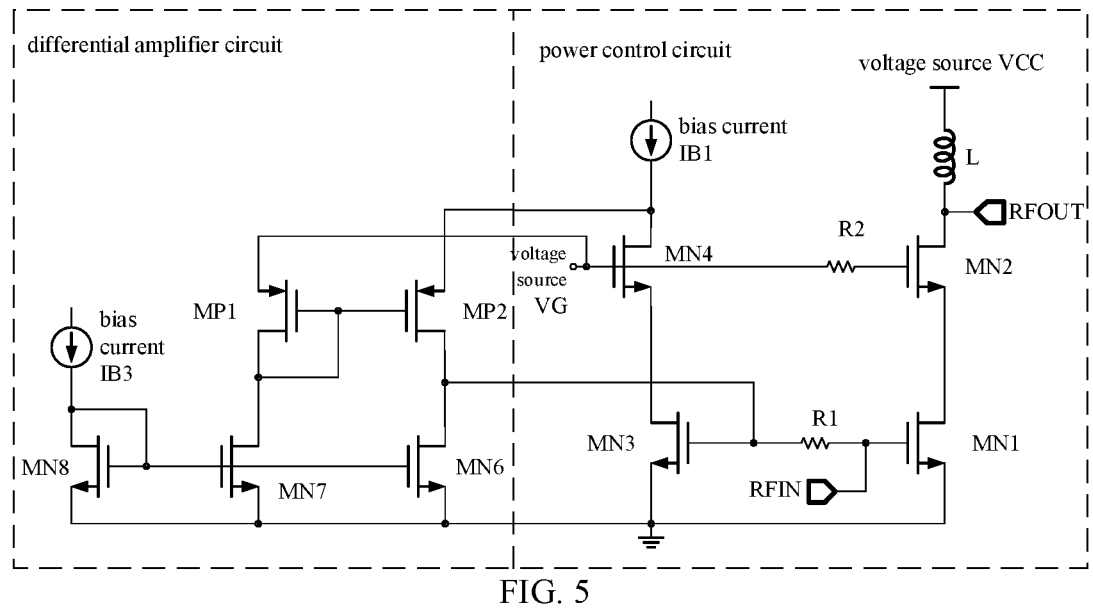
FIG. 5 is a schematic circuit diagram of the first application of a power control circuit of an embodiment of the disclosure.

FIG. 5 is a schematic circuit diagram of the first application of a power control circuit of an embodiment of the disclosure. As illustrated in FIG. 5, the differential amplifier circuit in the left dashed box is the specific circuit diagram of the differential amplifier of the power control circuit in FIG. 4.

Herein, the differential amplifier circuit includes: a bias current source IB3, a transistor MN8, a transistor MN7, a transistor MN6, a transistor MP1 and a transistor MP2; drain and gate of the transistor MN8 are short-circuited, and the drain of the transistor MN8 is connected with the bias current source IB3; a drain of the transistor MN7 is connected with a drain of the transistor MP1; a drain of the transistor MN6 is connected with a drain of the transistor MP2; the sources of the transistors MN8, MN7 and MN6 are all connected with a ground terminal, the gate of the transistor MN8 is connected with a gate of the transistor MN7, the gate of the transistor MN7 is connected with a gate of the transistor MN6; the drain and gate of the transistor MP1 are short-circuited, the gate of the transistor MP1 is connected with a gate of the transistor MP2. Herein, the value of width-length ratio of the transistor MN7 and the transistor MN6 is equal to the value of width-length ratio of the transistor MP1 and the transistor MP2. Furthermore, it may be concluded that the gate-source voltage of the transistor MP1 is equal to the gate-source voltage of the transistor MP2.

Other parts of the power control circuit include: a bias current source IB1, a voltage source VG, a voltage source VCC, a transistor MN4, a transistor MN3, a transistor MN2, a transistor MN1, a resistor R1, a resistor R2, an inductor L, a radio frequency signal input end RFIN and a radio frequency signal output end RFOUT; herein, a gate of the transistor MN4 is connected with the voltage source VG, a drain of the transistor MN4 is connected with the bias current source IB1, and a source of the transistor MN4 is connected with a drain of the transistor MN3; a source of the transistor MN3 is connected with the ground terminal; a gate of the transistor MN1 is connected with the radio frequency signal input end RFIN, a source of the transistor MN1 is connected with the ground terminal, a drain of the transistor MN1 is connected with a source of the transistor MN2; a drain of the transistor MN2 is connected with the radio frequency signal output end RFOUT, the radio frequency signal output end RFOUT is connected with one end of the inductor L, and the other end of the inductor L is connected with the voltage source VCC; a gate of the transistor MN2 is connected with the gate of the transistor MN4 via the resistor R2; the gate of the transistor MN1 is connected with a gate of the transistor MN3 via the resistor R1.

The source of the transistor MP2 is connected with the drain of the transistor MN4, the source of the transistor MP1 is connected with the voltage source VG, and the gate of the transistor MN3 is connected with the drains of the transistor MN6 and the transistor MP2. The transistor MP2 of the operational amplifier circuit, the transistors MN3 and MN4 of the power amplifier circuit form a negative feedback loop.

Since the gate-source voltage of the transistor MP1 is equal to the gate-source voltage of the transistor MP2, and the gate of the transistor MP1 is connected with the gate of the transistor MP2, the gate voltage of the transistor MP2 is equal to the voltage source VG minus the gate-source voltage of the transistor MP1, that is, the source voltage of the transistor MP2 is equal to VG, that is, the drain voltage of the transistor MN4 is equal to VG, and the transistor MN4 operates in a saturation region.

The transistor MN2 also operates in the saturation region, and the gate of the transistor MN4 and the gate of the transistor MN2 are both connected with the voltage source VG, so that the source voltage of the transistor MN2 is equal to the source voltage of the transistor MN4; since the source of the transistor MN4 is connected with the drain of the transistor MN3, and the drain of the transistor MN1 is connected with the source of the transistor MN2, the drain voltage of the transistor MN3 is equal to the drain voltage of the transistor MN1, and there is no large deviation when the bias current source IB1 passing through the transistor MN3 is mirrored to the transistor MN1, thereby improving the control accuracy of the bias current of the transistor MN1.

Figure 6:
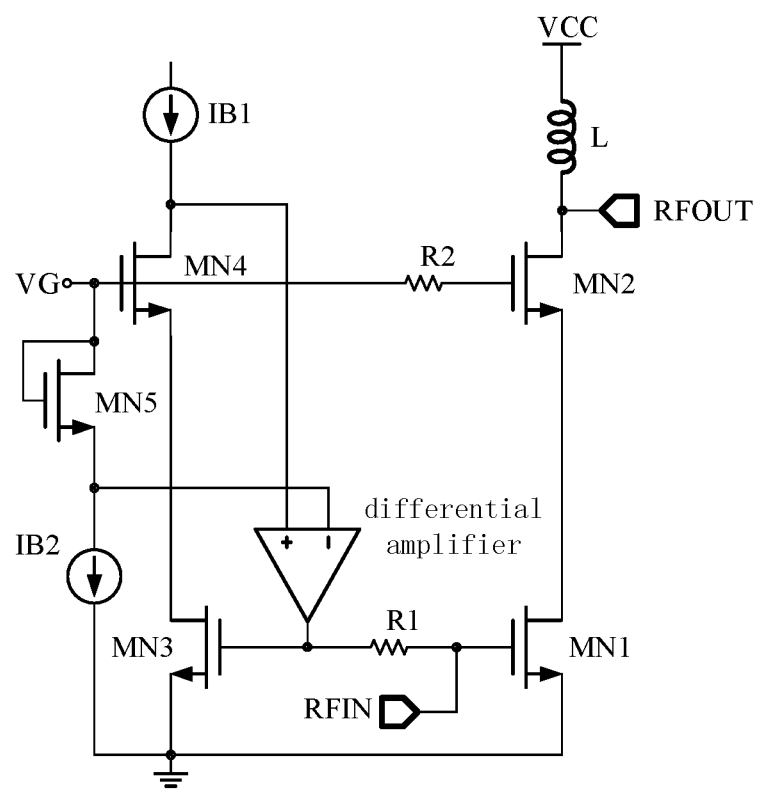
FIG. 6 is a schematic structural diagram of the third composition of a power control circuit of an embodiment of the disclosure.

In view of the schematic structural diagram of the first composition of a power control circuit in FIG. 3, the disclosure gives another specific circuit diagram, FIG. 6 is a schematic structural diagram of the third composition of a power control circuit of an embodiment of the disclosure. That is, a transistor MN5 and a bias current source IB2 are added on the basis of FIG. 3. Specifically, the connection of the circuit of FIG. 6 is described as follows:

the power control circuit includes: a radio frequency signal path and a negative feedback loop; the radio frequency signal path includes: a transistor MN1, a transistor MN2 and a voltage source VCC; a gate of the transistor MN1 is configured as a radio frequency signal input end, a drain of the transistor MN1 is connected with a source of the transistor MN2, and a source of the transistor MN1 is connected with a ground terminal; a drain of the transistor MN2 is configured as a radio frequency signal output end and is connected with the voltage source VCC; the negative feedback loop includes: a transistor MN3, a transistor MN4 and a differential amplifier; a gate of the transistor MN3 is connected with an output end of the differential amplifier, a source of the transistor MN3 is connected with the ground terminal, and a drain of the transistor MN3 is connected with a source of the transistor MN4; a drain of the transistor MN4 is connected with a forward input end of the differential amplifier and is connected with a bias current source IB1; a gate of the transistor MN4 is connected with a voltage source VG; the power control circuit further includes: a transistor MN5 and a bias current source IB2; the gate of the transistor MN4 is connected with a reverse input end of the differential amplifier via the transistor MN5, specifically, the gate of the transistor MN4 is connected with a drain of the transistor MN5; a source of the transistor MN5 is connected with the reverse input end of the differential amplifier; the drain and gate of the transistor MN5 are short-circuited, the source of the transistor MN5 is connected with one end of the bias current source IB2; the other end of the bias current source IB2 is connected with the ground terminal; the gate of the transistor MN1 is connected with the gate of the transistor MN3; a gate of the transistor MN2 is connected with the voltage source VG; each of the transistor MN2 and the transistor MN4 operates in a saturation region, so that power control of the transistor MN1 is performed.

In the above technical solution, the radio frequency signal path does not pass through the analog signal, that is, the analog signal does not interfere with the radio frequency signal, and does not reduce the performance of the radio frequency power amplifier.

In some embodiments, the value of width-length ratio of the third NMOS transistor and the first NMOS transistor is equal to the value of width-length ratio of the fourth NMOS transistor and the second NMOS transistor.

In some embodiments, the power control circuit further includes: a first resistor; the gate of the first NMOS transistor is connected with the output end of the differential amplifier via the first resistor.

Specifically, one end of resistor R1 is connected with the output end of the differential amplifier, and the other end of the resistor R1 is connected with the gate of the transistor MN1.

In some embodiments, the power control circuit further includes: a second resistor; the gate of the second NMOS transistor is connected with the second voltage source via the second resistor.

Specifically, one end of resistor R2 is connected with the voltage source VG and is also connected with the reverse input end of the differential amplifier, the other end of the resistor R2 is connected with the gate of the transistor MN2.

In some embodiments, the power control circuit further includes: an inductor; the drain of the second NMOS transistor is connected with the first voltage source via the inductor.

Specifically, one end of inductor L is connected with the drain of the transistor MN2 and the other end of the inductor L is connected with the voltage source VCC.

In some embodiments, threshold voltage of the fifth NMOS transistor is equal to threshold voltage of the fourth NMOS transistor; the fifth NMOS transistor operates in a weak inversion region.

Specifically, the transistor MN5 operates in the weak inversion region, so that the gate-source voltage of the transistor MN5 is equal to the threshold voltage thereof, herein, the condition for an NMOS transistor operating in a weak inversion region is that the gate-source voltage thereof is equal to the threshold voltage thereof; since the gate of the transistor MN5 is connected with the gate of the transistor MN4, and the gate of the transistor MN4 is connected with the voltage source VG, the source voltage of the transistor MN5 is equal to the voltage source VG minus the threshold voltage of the transistor MN5.

Since the drain of the transistor MN4 is connected with the forward input end of the differential amplifier and the source of the transistor MN5 is connected with the inverse input end of the differential amplifier, the drain voltage of the transistor MN4 is equal to the source voltage of the transistor MN5. Furthermore, the drain-source voltage of the transistor MN4 is equal to the gate-source voltage of the transistor MN4 minus the threshold voltage thereof, and the transistor MN4 operates in the saturation region.

Furthermore, it is known that the transistor MN2 operates in the saturation region, and the transistor MN4 also operates in the saturation region; and the gate of the transistor MN2 and the gate of the transistor MN4 are both connected with the voltage source VG; based on the above two conditions, it is concluded that the source voltage of the transistor MN2 is equal to the source voltage of the transistor MN4.

The source of the transistor MN4 is connected with the drain of the transistor MN3, the drain of the transistor MN1 is connected with the source of the transistor MN2, so that the source voltage of the transistor MN4 is equal to the drain voltage of the transistor MN3, and the source voltage of the transistor MN2 is equal to the drain voltage of the transistor MN1. Furthermore, the drain voltage of the transistor MN3 is equal to the drain voltage of the transistor MN1, thus there is no large deviation when the bias current source IB1 passing through the transistor MN3 is mirrored to the transistor MN1, thereby improving the control accuracy of the bias current passing through the transistor MN1.

The disclosure discloses a power control circuit, including: a radio frequency signal path and a negative feedback loop; the radio frequency signal path includes: a first NMOS transistor and a second NMOS transistor; a gate of the first NMOS transistor is configured as a radio frequency signal input end, a drain of the first NMOS transistor is connected with a source of the second NMOS transistor, and a source of the first NMOS transistor is connected with a ground terminal; a drain of the second NMOS transistor is configured as a radio frequency signal output end and is connected with a first voltage source; the negative feedback loop includes: a third NMOS transistor, a fourth NMOS transistor and a differential amplifier; a gate of the third NMOS transistor is connected with an output end of the differential amplifier, a source of the third NMOS transistor is connected with the ground terminal, and a drain of the third NMOS transistor is connected with a source of the fourth NMOS transistor; a gate of the fourth NMOS transistor is connected with a reverse input end of the differential amplifier and is connected with a second voltage source, and a drain of the fourth NMOS transistor is connected with a forward input end of the differential amplifier and is connected with a first bias current source; the gate of the first NMOS transistor is connected with the output end of the differential amplifier; a gate of the second NMOS transistor is connected with a second voltage source; each of the second NMOS transistor and the fourth NMOS transistor operates in a saturation region. As such, the radio frequency signal path does not pass through the analog signal, the performance of the first NMOS transistor is not affected, while the control accuracy of the output power is improved.

Figure 7:
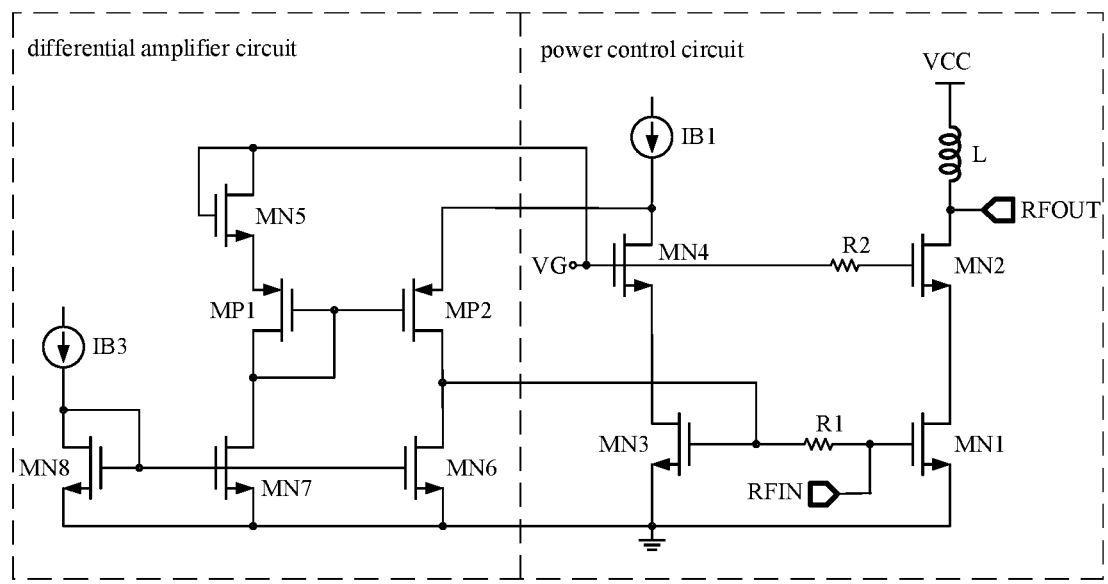
FIG. 7 is a schematic circuit diagram of the second application of a power control circuit of an embodiment of the disclosure.

FIG. 7 is a schematic circuit diagram of the second application of a power control circuit of an embodiment of the disclosure. As illustrated in FIG. 7, the differential amplifier circuit in the left dashed box is the specific circuit diagram of the differential amplifier of the power control circuit in FIG. 6. Herein, the source of the transistor MN5 is connected with the source of the transistor MP1, so that the bias current source IB2 in FIG. 6 may be omitted.

Herein, the differential amplifier circuit includes: a bias current source IB3, a transistor MN8, a transistor MN7, a transistor MN6, a transistor MN5, a transistor MP1 and a transistor MP2; drain and gate of the transistor MN8 are short-circuited, and the drain of the transistor MN8 is connected with the bias current source IB3; a drain of the transistor MN7 is connected with a drain of the transistor MP1; a drain of the transistor MN6 is connected with a drain of the transistor MP2; the sources of the transistors MN8, MN7 and MN6 are all connected with a ground terminal, the gate of the transistor MN8 is connected with a gate of the transistor MN7, the gate of the transistor MN7 is connected with a gate of the transistor MN6; gate and drain of the transistor MN5 are short-circuited, a source of the transistor MN5 is connected with a source of the transistor MP1; the drain and gate of the transistor MP1 are short-circuited, the gate of the transistor MP1 is connected with a gate of the transistor MP2. Herein, the value of width-length ratio of the transistor MN7 and the transistor MN6 is equal to the value of width-length ratio of the transistor MP1 and the transistor MP2, Furthermore, it may be concluded that the gate-source voltage of the transistor MP1 is equal to the gate-source voltage of the transistor MP2; the transistor MN5 operates in a weak inversion region, thus the gate-source voltage of the transistor MN5 is equal to the threshold voltage thereof.

Other parts of the power control circuit include: a bias current source IB1, a voltage source VG, a voltage source VCC, a transistor MN4, a transistor MN3, a transistor MN2, a transistor MN1, a resistor R1, a resistor R2, an inductor L, a radio frequency signal input end RFIN and a radio frequency signal output end RFOUT; herein, a gate of the transistor MN4 is connected with the voltage source VG, a drain of the transistor MN4 is connected with the bias current source IB1, and a source of the transistor MN4 is connected with a drain of the transistor MN3; a source of the transistor MN3 is connected with the ground terminal; a gate of the transistor MN1 is connected with the radio frequency signal input end RFIN, a source of the transistor MN1 is connected with the ground terminal, a drain of the transistor MN1 is connected with a source of the transistor MN2; a drain of the transistor MN2 is connected with the radio frequency signal output end RFOUT, the radio frequency signal output end RFOUT is connected with one end of the inductor L, and the other end of the inductor L is connected with the voltage source VCC; a gate of the transistor MN2 is connected with the gate of the transistor MN4 via the resistor R2; the gate of the transistor MN1 is connected with a gate of the transistor MN3 via the resistor R1.

The source of the transistor MP2 is connected with the drain of the transistor MN4, the source of the transistor MN5 is connected with the voltage source VG, and the gate of the transistor MN3 is connected with the drains of the transistor MN6 and the transistor MP2.

Since the gate-source voltage of the transistor MP1 is equal to the gate-source voltage of the transistor MP2, the gate of the transistor MP1 is connected with the gate of the transistor MP2, the source of the transistor MP1 is connected with the source of the transistor MN5, the source of the transistor MP2 is connected with the drain of the transistor MN4, and the threshold voltage of the transistor MN5 is equal to the threshold voltage of the transistor MN4, the drain voltage of the transistor MN4 is equal to VG minus the threshold voltage thereof, that is, the transistor MN4 operates in a saturation region.

The transistor MN2 also operates in the saturation region, and the gate of the transistor MN4 and the gate of the transistor MN2 are both connected with the voltage source VG, so that the source voltage of the transistor MN2 is equal to the source voltage of the transistor MN4; since the source of the transistor MN4 is connected with the drain of the transistor MN3, and the drain of the transistor MN1 is connected with the source of the transistor MN2, the drain voltage of the transistor MN3 is equal to the drain voltage of the transistor MN1, and there is no large deviation when the bias current source IB1 passing through the transistor MN3 is mirrored to the transistor MN1, thereby improving the control accuracy of the bias current of the transistor MN1.

The above descriptions are only specific embodiments of the disclosure, but the protection scope of the disclosure is not limited to thereto, and any technicians familiar with this technical field may easily conceive of changes or substitutions within the technical scope disclosed in the disclosure, which should be covered within the protection scope of the disclosure. Therefore, the protection scope of the disclosure shall be based on the protection scope of the claims.

The disclosure discloses a power control circuit, including: a radio frequency signal path and a negative feedback loop; the radio frequency signal path includes: a first NMOS transistor and a second NMOS transistor; a gate of the first NMOS transistor is configured as a radio frequency signal input end, a drain of the first NMOS transistor is connected with a source of the second NMOS transistor, and a source of the first NMOS transistor is connected with a ground terminal; a drain of the second NMOS transistor is configured as a radio frequency signal output end and is connected with a first voltage source; the negative feedback loop includes: a third NMOS transistor, a fourth NMOS transistor and a differential amplifier; a gate of the third NMOS transistor is connected with an output end of the differential amplifier, a source of the third NMOS transistor is connected with the ground terminal, and a drain of the third NMOS transistor is connected with a source of the fourth NMOS transistor; a gate of the fourth NMOS transistor is connected with a reverse input end of the differential amplifier and is connected with a second voltage source, and a drain of the fourth NMOS transistor is connected with a forward input end of the differential amplifier and is connected with a first bias current source; the gate of the first NMOS transistor is connected with the output end of the differential amplifier; a gate of the second NMOS transistor is connected with the second voltage source; each of the second NMOS transistor and the fourth NMOS transistor operates in a saturation region. As such, the radio frequency signal path does not pass through the analog signal, the performance of the first NMOS transistor is not affected, while the control accuracy of the output power is improved.

In several embodiments provided in the disclosure, it should be understood that the disclosed device and method may be implemented in other ways. The above-mentioned device embodiments are merely illustrative, for example, the division of the units is only a division based on logical functions, and there may be other divisions in actual implementations, e.g., multiple units or components may be combined, or may be integrated in another system, or some features may be ignored, or may not be performed. In addition, the coupling, or direct coupling, or communication connection between the components illustrated or discussed may be indirect coupling or communication connection through some interfaces, devices or units, which may be electrical, mechanical or otherwise.

The above-mentioned units illustrated as separate components may be or may not be physically separated, and the components illustrated as units may be or may not be physical units, i.e., they may be located in one place or distributed to multiple network units; some or all of the units may be selected according to actual needs to achieve the purpose of the solutions of the embodiments.

In addition, each functional unit in each of the embodiments of the disclosure may be all integrated in a processing unit, or each unit may be separately present as a single unit, or two or more units may be integrated in a single unit; the above integrated units may be realized either in the form of hardware or in the form of hardware together with software functional units.

Those ordinarily skilled in the art may understand that all or a part of the steps for realizing the above-mentioned embodiments of the method may be realized by hardware related to program instructions, and the above-mentioned program may be stored in a computer readable storage medium, and when the program is executed, the steps including the above-mentioned embodiments of the method are executed; and the above-mentioned storage medium includes various medium that may store program codes, such as mobile storage devices, Read-Only Memory (ROM), Random Access Memory (RAM), magnetic disks or optical disks, etc.

Or, the above integrated unit in the disclosure may also be stored in a computer-readable storage medium, when it is implemented as a software function module and sold or used as an individual product. Based on such understanding, the technical solutions of the embodiments of the disclosure substantially or the part contributing to the related art may be embodied in the form of a software product, and the computer software product is stored in a storage medium and includes several instructions to allow a computer device (which may be a personal computer, a server, or a network equipment, etc.) to execute all or part of the method described in each of the embodiments of the disclosure. And the aforementioned storage medium includes various medium that may store program codes, such as mobile storage devices, ROM, RAM, magnetic disks or optical disks etc.

While this specification contains many specific implementation details, these should not be construed as limitations on the scope of any claims, but rather as descriptions of features specific to particular implementations. Certain features that are described in this specification in the context of separate implementations can also be implemented in combination in a single implementation. Conversely, various features that are described in the context of a single implementation can also be implemented in multiple implementations separately or in any suitable subcombination.

Moreover, although features can be described above as acting in certain combinations and even initially claimed as such, one or more features from a claimed combination can in some cases be excised from the combination, and the claimed combination can be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing can be advantageous. Moreover, the separation of various system components in the implementations described above should not be understood as requiring such separation in all implementations, and it should be understood that the described program components and systems can generally be integrated together in a single software product or packaged into multiple software products.

As such, particular implementations of the subject matter have been described. Other implementations are within the scope of the following claims. In some cases, the actions recited in the claims can be performed in a different order and still achieve desirable results. In addition, the processes depicted in the accompanying figures do not necessarily require the particular order shown, or sequential order, to achieve desirable results. In certain implementations, multitasking or parallel processing can be utilized.

The above description includes part of embodiments of the present disclosure, and not limits the present disclosure. Any modifications, equivalent substitutions, improvements, etc., within the spirit and principles of the present disclosure, are included in the scope of protection of the present disclosure.

It is apparent that those of ordinary skill in the art can make various modifications and variations to the embodiments of the disclosure without departing from the spirit and scope of the disclosure. Thus, it is intended that the present disclosure cover the modifications and the modifications.

Various embodiments in this specification have been described in a progressive manner, where descriptions of some embodiments focus on the differences from other embodiments, and same or similar parts among the different embodiments are sometimes described together in only one embodiment.

It should also be noted that in the present disclosure, relational terms such as first and second, etc., are only used to distinguish one entity or operation from another entity or operation, and do not necessarily require or imply these entities having such an order or sequence. It does not necessarily require or imply that any such actual relationship or order exists between these entities or operations.

Moreover, the terms "include," "including," or any other variations thereof are intended to cover a non-exclusive inclusion within a process, method, article, or apparatus that comprises a list of elements including not only those elements but also those that are not explicitly listed, or other elements that are inherent to such processes, methods, goods, or equipment.

In the case of no more limitation, the element defined by the sentence "includes a . . . " does not exclude the existence of another identical element in the process, the method, or the device including the element.

Specific examples are used herein to describe the principles and implementations of some embodiments. The description is only used to help convey understanding of the possible methods and concepts. Meanwhile, those of ordinary skill in the art can change the specific manners of implementation and application thereof without departing from the spirit of the disclosure. The contents of this specification therefore should not be construed as limiting the disclosure.

For example, in the description of the present disclosure, the terms "some embodiments," or "example," and the like may indicate a specific feature described in connection with the embodiment or example, a structure, a material or feature included in at least one embodiment or example. In the present disclosure, the schematic representation of the above terms is not necessarily directed to the same embodiment or example.

Moreover, the particular features, structures, materials, or characteristics described can be combined in a suitable manner in any one or more embodiments or examples. In addition, various embodiments or examples described in the specification, as well as features of various embodiments or examples, can be combined and reorganized.

In the descriptions, with respect to circuit(s), unit(s), device(s), component(s), etc., in some occurrences singular forms are used, and in some other occurrences plural forms are used in the descriptions of various embodiments. It should be noted; however, the single or plural forms are not limiting but rather are for illustrative purposes. Unless it is expressly stated that a single unit, device, or component etc. is employed, or it is expressly stated that a plurality of units, devices or components, etc. are employed, the circuit(s), unit(s), device(s), component(s), etc. can be singular, or plural.

Based on various embodiments of the present disclosure, the disclosed apparatuses, devices, and methods can be implemented in other manners. For example, the abovementioned devices can employ various methods of use or implementation as disclosed herein.

In the present disclosure, the terms "installed," "connected," "coupled," "fixed" and the like shall be understood broadly, and may be either a fixed connection or a detachable connection, or integrated, unless otherwise explicitly defined. These terms can refer to mechanical or electrical connections, or both. Such connections can be direct connections or indirect connections through an intermediate medium. These terms can also refer to the internal connections or the interactions between elements. The specific meanings of the above terms in the present disclosure can be understood by those of ordinary skill in the art on a case-by-case basis.

Dividing the device into different "regions," "units," "components" or "layers," etc. merely reflect various logical functions according to some embodiments, and actual implementations can have other divisions of "regions," "units," "components" or "layers," etc. realizing similar functions as described above, or without divisions. For example, multiple regions, units, or layers, etc. can be combined or can be integrated into another system. In addition, some features can be omitted, and some steps in the methods can be skipped.

Those of ordinary skill in the art will appreciate that the units, components, regions, or layers, etc. in the devices provided by various embodiments described above can be provided in the one or more devices described above. They can also be located in one or multiple devices that is (are) different from the example embodiments described above or illustrated in the accompanying drawings. For example, the units, regions, or layers, etc. in various embodiments described above can be integrated into one module or divided into several sub-modules.

The various device components, modules, units, blocks, or portions may have modular configurations, or are composed of discrete components, but nonetheless can be referred to as "modules" in general. In other words, the "components," "modules," "blocks," "portions," or "units" referred to herein may or may not be in modular forms, and these phrases may be interchangeably used.

Moreover, the terms "first" and "second" are used for descriptive purposes only and are not to be construed as indicating or implying a relative importance or implicitly indicating the number of technical features indicated. Thus, elements referred to as "first" and "second" may include one or more of the features either explicitly or implicitly. In the description of the present disclosure, "a plurality" indicates two or more unless specifically defined otherwise.

The order of the various embodiments described above are only for the purpose of illustration, and do not represent preference of embodiments.

Although specific embodiments have been described above in detail, the description is merely for purposes of illustration. It should be appreciated, therefore, that many aspects described above are not intended as required or essential elements unless explicitly stated otherwise.

Various modifications of, and equivalent acts corresponding to the disclosed aspects of the exemplary embodiments can be made in addition to those described above by a person of ordinary skill in the art having the benefit of the present disclosure without departing from the spirit and scope of the disclosure contemplated by this disclosure and as defined in the following claims. As such, the scope of this disclosure is to be accorded the broadest reasonable interpretation so as to encompass such modifications and equivalent structures.

What is claimed is:

1. A power control circuit, comprising:
a radio frequency signal path; and
a negative feedback loop;
wherein
the radio frequency signal path comprises: a first NMOS transistor and a second NMOS transistor;
a gate of the first NMOS transistor is configured as a radio frequency signal input end, a drain of the first NMOS transistor is connected with a source of the second NMOS transistor, and a source of the first NMOS transistor is connected with a ground terminal; a drain of the second NMOS transistor is configured as a radio frequency signal output end and is connected with a first voltage source;
the negative feedback loop comprises: a third NMOS transistor, a fourth NMOS transistor and a differential amplifier;
a gate of the third NMOS transistor is connected with an output end of the differential amplifier, a source of the third NMOS transistor is connected with the ground terminal, and a drain of the third NMOS transistor is connected with a source of the fourth NMOS transistor;
a gate of the fourth NMOS transistor is connected with a reverse input end of the differential amplifier and is connected with a second voltage source, and a drain of the fourth NMOS transistor is connected with a forward input end of the differential amplifier and is connected with a first bias current source;
the gate of the first NMOS transistor is connected with the output end of the differential amplifier; a gate of the second NMOS transistor is connected with the second voltage source;
each of the second NMOS transistor and the fourth NMOS transistor operates in a saturation region, so that power control of the first NMOS transistor is performed;
the power control circuit further comprising:
a first resistor; wherein the gate of the first NMOS transistor is connected with the output end of the differential amplifier via the first resistor;
a second resistor; wherein the gate of the second NMOS transistor is connected with the second voltage source via the second resistor; and
an inductor; wherein the drain of the second NMOS transistor is connected with the first voltage source via the inductor.

2. The power control circuit of claim 1, wherein
a value of width-length ratio of the third NMOS transistor and the first NMOS transistor is equal to a value of width-length ratio of the fourth NMOS transistor and the second NMOS transistor.

3. The power control circuit of claim 1, wherein
when drain voltage and gate voltage of the fourth NMOS transistor are equal, the fourth NMOS transistor operates in the saturation region.

4. The power control circuit of claim 1, further comprising: a fifth NMOS transistor; wherein
the gate of the fourth NMOS transistor is connected with the reverse input end of the differential amplifier via the fifth NMOS transistor;
the gate of the fourth NMOS transistor is connected with a drain of the fifth NMOS transistor; a source of the fifth NMOS transistor is connected with the reverse input end of the differential amplifier; the drain and gate of the fifth NMOS transistor are short-circuited;
the source of the fifth NMOS transistor is connected with a first end of a second bias current source; a second end of the second bias current source is connected with the ground terminal.

5. The power control circuit of claim 4, wherein
a threshold voltage of the fifth NMOS transistor is equal to threshold voltage of the fourth NMOS transistor; the fifth NMOS transistor operates in a weak inversion region.

6. The power control circuit of claim 4, wherein
when a drain voltage of the fourth NMOS transistor is equal to gate voltage of the fourth NMOS transistor minus threshold voltage thereof, the fourth NMOS transistor operates in the saturation region.

7. A wireless communication apparatus comprising the power control circuit of claim 1, wherein the radio frequency signal path does not pass through analog signals, without affecting performance of the first NMOS transistor, while control accuracy of the power control circuit is improved.

8. The apparatus of claim 7, wherein
a value of width-length ratio of the third NMOS transistor and the first NMOS transistor is equal to a value of width-length ratio of the fourth NMOS transistor and the second NMOS transistor.

9. The apparatus of claim 7, wherein
when drain voltage and gate voltage of the fourth NMOS transistor are equal, the fourth NMOS transistor operates in the saturation region.

10. The apparatus of claim 7, further comprising: a fifth NMOS transistor; wherein
the gate of the fourth NMOS transistor is connected with the reverse input end of the differential amplifier via the fifth NMOS transistor;
the gate of the fourth NMOS transistor is connected with a drain of the fifth NMOS transistor; a source of the fifth NMOS transistor is connected with the reverse input end of the differential amplifier; the drain and gate of the fifth NMOS transistor are short-circuited;
the source of the fifth NMOS transistor is connected with a first end of a second bias current source; a second end of the second bias current source is connected with the ground terminal.

11. The apparatus of claim 10, wherein
a threshold voltage of the fifth NMOS transistor is equal to threshold voltage of the fourth NMOS transistor; the fifth NMOS transistor operates in a weak inversion region.

12. The apparatus of claim 10, wherein
when a drain voltage of the fourth NMOS transistor is equal to gate voltage of the fourth NMOS transistor minus threshold voltage thereof, the fourth NMOS transistor operates in the saturation region.

\* \* \* \* \*